(12) United States Patent
Torti

(10) Patent No.: US 8,717,825 B2
(45) Date of Patent: May 6, 2014

(54) MEMORY DEVICE AND CORRESPONDING READING METHOD

(75) Inventor: Cesare Torti, Pavia (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 94 days.

(21) Appl. No.: 13/331,396

(22) Filed: Dec. 20, 2011

(65) Prior Publication Data
US 2012/0155185 A1 Jun. 21, 2012

(30) Foreign Application Priority Data

Dec. 21, 2010 (IT) ............................... MI2010A2343

(51) Int. Cl.
*G11C 11/40* (2006.01)

(52) U.S. Cl.
USPC ............ 365/185.25; 365/185.13; 365/185.21; 365/189.02; 365/189.15; 365/189.06; 365/203

(58) Field of Classification Search
USPC ............. 365/185.13, 185.21, 185.25, 189.02, 365/189.15, 189.06, 203
See application file for complete search history.

(56) References Cited

U.S. PATENT DOCUMENTS

| | | | | |
|---|---|---|---|---|
| 5,973,961 A | * | 10/1999 | Park et al. ................. | 365/185.13 |
| 7,236,403 B2 | | 6/2007 | Deml et al. ............... | 365/185.25 |
| 7,542,343 B1 | | 6/2009 | Kim .......................... | 365/185.11 |
| 2002/0008992 A1 | * | 1/2002 | Tanaka et al. ............. | 365/185.13 |
| 2003/0210581 A1 | * | 11/2003 | Lee et al. .................. | 365/200 |
| 2007/0195601 A1 | * | 8/2007 | Omoto ..................... | 365/185.13 |
| 2008/0031075 A1 | | 2/2008 | Hong et al. ............... | 365/230.03 |
| 2009/0245002 A1 | * | 10/2009 | Matsui et al. ............. | 365/207 |
| 2010/0080039 A1 | | 4/2010 | Choi et al. ................ | 365/148 |
| 2010/0128516 A1 | | 5/2010 | Cho et al. ................. | 365/163 |

OTHER PUBLICATIONS

Deml et al., "A 0.13 μm 2.125MB 23.5ns Embedded Flash with 2GB/s Throughput for Automotive Microcontrollers" IEEE, ISSCC 2007, Session 26, Non-Volatile Memories, 26.4, pp. 478,479,617.

* cited by examiner

*Primary Examiner* — Huan Hoang
*Assistant Examiner* — Jay Radke
(74) *Attorney, Agent, or Firm* — Allen, Dyer, Doppelt, Milbrath & Gilchrist, P.A.

(57) ABSTRACT

An electrically erasable and programmable non-volatile memory device includes memory cells arranged in rows and columns, and each column of memory cells is associated with a respective local bit line. The local bit lines are divided into packets of local bit lines, each packet of local bit lines associated with a respective main bit line. Each local bit line is selectively couplable to the respective main bit line by a corresponding selector. Each local bit line is selectively couplable to a reference terminal, for receiving a reference voltage, by a corresponding discharge selector. Each discharge selector is active when the memory device is in a standby state. The non-volatile memory device further includes biasing circuitry to bias each main bit line to a pre-charge voltage during operation, and reading circuitry to select and access a group of memory cells during reading operations.

14 Claims, 5 Drawing Sheets

MEMORY DEVICE AND CORRESPONDING READING METHOD

FIELD OF THE INVENTION

The present invention relates to the field of solid-state memory devices. In particular, the invention relates to non-volatile electrically erasable and programmable memory devices. In greater detail, the present invention relates to flash memory devices.

BACKGROUND OF THE INVENTION

The non-volatile electrically erasable and programmable memory devices—also identified by the acronym EEPROM, "Electrically Erasable Programmable Read Only Memory"—have reached a widespread use in the electronic applications market (from the industrial to the consumer level). Such a wide use is due to special features, such as the ability of retaining information without power supply, allowing the editing of the information thereof, and providing greater reliability than other storage devices, such as magnetic disk storage devices.

The flash memory devices are, currently, the most widespread type of EEPROM devices in that, besides the features above mentioned, they have a very high storage capacity and present at the same time very reduced dimensions.

The memory cells of a flash device may be arranged in a matrix according to a NOR architecture or a NAND architecture. In short, in a NOR architecture the memory cells of the same column of the matrix are connected in parallel to a same column line—or "bit line"—while in a NAND architecture groups of memory cells of the same column of the matrix are connected to each other in series in order to form respective strings, which are then connected in parallel to one another to a same bit line.

The matrix of memory cells of the flash memory devices of the NOR type can be structured according to a column-hierarchy. In this case, the columns of memory cells of the matrix are divided into clusters, each of which consists of a determined number of columns of memory cells. The memory cells of each column are associated with a respective local bit line, while each column cluster is associated with a respective main bit line. During a reading operation, a local bit line for each cluster is selected by selectively coupling it to the corresponding main bit line. In addition, a selected group of main bit lines is selectively coupled to suitable circuitry for the reading of data stored in the memory cells (sense amplifier). Consequently, during a reading operation, each sense amplifier is associated with a corresponding selected local bit line belonging to the selected clusters.

The parasitic capacitances of the local bit lines and of the main bit lines are typically discharged to the ground voltage and then pre-charged to a suitable voltage level before each reading operation. However, the parasitic capacitance of a main bit line has a big entity, since the main bit lines are typically provided with a relatively high length and width, higher than those of the local bit line. Therefore, the time required to discharge and then pre-charge such capacitances is not negligible, and thus increases the overall duration of the reading operation, greatly reducing the performance of the memory device.

During a reading operation, main bit lines are typically pre-charged and discharged in parallel. Given the non-negligible entity of the parasitic capacitances associated with each main bit line, such discharge and pre-charge operations involves as a whole the moving a large amount of charge, implying peaks of power consumption that would result in an effort for the supply circuits of the device, a temperature increase thereof, and above all, electromagnetic emissions that reduce the electromagnetic compatibility of the memory device.

The electronics industry has proposed several solutions to overcome the abovementioned drawbacks. A known technique provides for the reduction of the length of the main bit lines—thereby reducing the capacitance associated with it and the structure of the main bit lines according to a hierarchical solution, where more main bit lines are selectively connectable to a respective global bit line connected to a respective global sense amplifier. Such global bit line will be discharged and pre-charged with different timing than the main bit lines and the local bit lines, thereby distributing the power consumption over time and thus lowering the consumption peak. However, such a solution has a significant cost in terms of area and realization complexity.

A further solution is presented in the article "A 0.13 µm 2.125 MB 23.5 ns Embedded Flash with 2 GB/s Throughput for Automotive Microcontrollers" by Demi, Jankowski and Thalmaier (IEEE, ISSCC 2007, Session 26, Non-Volatile Memories, 26.4) in which is provided to maintain to a pre-charge voltage local bit lines and corresponding reference lines (source line) using an apposite pre-charge circuit. Upon selection, the pre-charge circuit is isolated from the local bit line and the corresponding source line. The source line is connected to a reference terminal, while the local bit line is connected to the sense amplifier through the main bit line. The capacitive coupling between the source line that is discharged and the local bit line causes a small change in voltage on the local bit line that is quickly attenuated by the sense amplifier.

A still further solution is presented in the U.S. Pat. No. 7,236,403 wherein is described a pre-charge arrangement for the reading operation of integrated non-volatile memories having at least one memory cell, at least one source line, at least one bit line, at least one sense amplifier and at least a pre-charge potential. The bit line constantly receives the pre-charge potential in a deselected state of the bit line, and the source line receives a predetermined reference potential, particularly a ground potential, in a selected state of the bit line.

SUMMARY OF THE INVENTION

In general terms, one or more embodiments of the present invention are intended to provide a memory device capable of ensuring an extremely fast reading operation without incurring in the abovementioned drawbacks.

More specifically, one embodiment provides an electrically erasable and programmable non-volatile memory device. The memory device includes a plurality of memory cells arranged in rows and columns. Each column of memory cells is associated with a respective local bit line. The local bit lines are divided into packets of local bit lines. Each packet of local bit lines is associated with a respective main bit line, in which each local bit line is selectively couplable to the respective main bit line by a corresponding selector. Each local bit line is selectively couplable to a reference terminal for receiving a reference voltage through a corresponding discharge selector.

Each discharge selector is active when the memory device is in a standby state. The non-volatile memory device further includes biasing means or circuitry adapted to bias each main bit line to a pre-charge voltage during the operation of the memory device, and reading means or circuitry adapted to select and to access a group of memory cells during a reading operation. The reading means or circuitry includes selection means or circuitry adapted to select each local bit line associated with each memory cell of the group by activating the corresponding selector and disabling the corresponding discharge selector. The reading means or circuitry further includes measure means or circuitry adapted to measure currents that flow in the selected local bit line for the reading of data stored in the memory cells of the group.

Another aspect of the present invention relates to a corresponding method for operating a memory device.

BRIEF DESCRIPTION OF THE DRAWINGS

Embodiments of the invention, as well as additional features and their advantages will be better understood with reference to the following detailed description, given merely by way of non-limiting example, to be read in conjunction with the attached figures (wherein corresponding elements are designated with the same or similar references and their explanation is not repeated for brevity). In this regard, it is expressly understood that the figures are not necessarily to scale (with some details that may be exaggerated and/or simplified) and, unless otherwise stated, they are simply used to conceptually illustrate the structures and procedures. In particular.

DETAILED DESCRIPTION OF THE PREFERRED EMBODIMENTS

Figure 1:
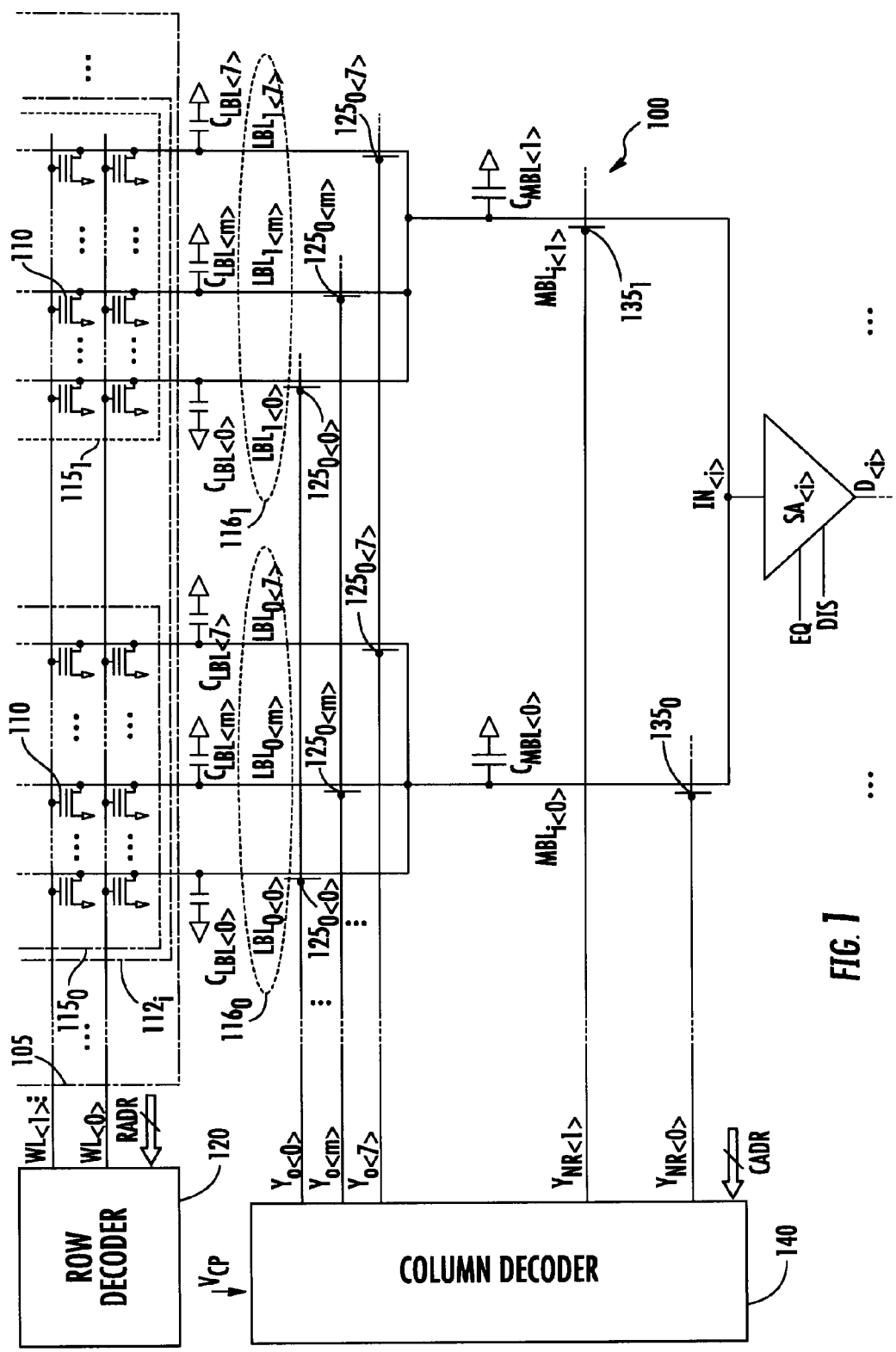
FIG. 1 illustrates a principle block diagram of a portion of a flash memory according to an implementation known in the art.

With reference to FIG. 1, a block diagram of a portion of a flash memory 100, according to an implementation known in the art, is shown. More specifically, the flash memory 100 includes a matrix 105 of memory cells 110 arranged in rows and columns. The columns of the matrix 105 are divided in a number n (e.g. n=128) of blocks of data $112_i$ (i=0, ..., n−1) divided into clusters $115_j$ (e.g. j=0, 1), each of which includes a predetermined number q of columns (e.g. q=8) of memory cells 110 adjacent to each other. Each memory cell 110 typically includes an N-channel MOS transistor with floating gate structure. For example, a typical flash memory of this type may comprise 2048 columns, organized in 128 blocks of data of 16 columns, each divided into two clusters of 8 columns.

The memory cell 110 is adapted to store a binary data (bit) in the form of electric charge stored in the floating gate, which defines a corresponding value of the threshold voltage of the transistor. The memory cell 110 may be programmed to a high threshold voltage (electrical charges trapped in floating gate) to store a bit corresponding to a first logical value (e.g. a low logic value "0") by applying a high programming voltage (e.g. 8-10 V) to the gate terminal. In contrast, the memory cell 110 is erased to a low threshold voltage (floating gate deprived of electric charge) to store a bit corresponding to a second logical value (e.g. a high logic value "1") by applying a high erasure difference potential (e.g. 10-15 V) between the source and gate terminals. To read a bit a reading voltage (e.g. 4 V) is applied to the gate terminal and the presence or absence of a current flow between source and drain terminals of the transistor is detected.

Each row of the matrix 105 is associated with a respective row line (word line), while each column is associated with a respective column line (bit line). The memory 100 has a NOR architecture, according to which memory cells 110 of a same column are connected, through the drain terminals, in parallel to the bit line corresponding to that column.

The memory cells 110 arranged on a same row of the matrix 105 are connected, by the control terminal, to a corresponding word line $WL_{<r>}$ (r=0, 1, ...) to be selected by a row decoder 120 in order to receive the programming, erasure and reading voltages. The column selection is performed according to a hierarchical bit line architecture with two hierarchical levels.

In particular, each column belonging to a cluster $115_j$ is associated with a respective local bit line $LBL_{j<m>}$ (m=0, 1, ..., q−1). The local bit lines $LBL_{j<m>}$ are, therefore, divided into respective packets $116_j$, each consisting of q local bit lines $LBL_{j<m>}$ associated with the respective q columns of the corresponding cluster $115_j$. Each memory cell 110 of each column is connected to the corresponding local bit line $LBL_{j<m>}$ through the drain terminal. The source terminal of each memory cell 110 is connected to a reference terminal to receive the ground voltage.

The local bit lines $LBL_{j<m>}$ of each packet $116_j$ are selectively connectable to a corresponding main bit line $MBL_{i<j>}$ by a corresponding local selector element $125_{j<m>}$, for example a N-channel MOS transistor having a drain terminal connected the local bit line $LBL_{j<m>}$, a source terminal connected to the main bit line $MBL_{i<j>}$ and a gate terminal controlled by a column decoder 140. Pairs of main bit lines $MBL_{i<j>}$—associated with packets $116_j$ of the clusters $115_j$ belonging to the same data block $112_i$—are selectively connectable to a corresponding sense amplifier $SA_{<i>}$ through a main selector element $135_{i<j>}$, such as a N-channel MOS transistor having a drain terminal connected to the main bit line $MBL_{i<j>}$, a source terminal connected to the sense amplifier $SA_{<i>}$, and a gate terminal controlled by the column decoder 140.

The row selection is performed by the row decoder 120, which receives a row address RADR, decodes it and selects a corresponding row. In particular, the row decoder 120 polarizes word line $WL_{<r>}$ corresponding to the selected memory cells to a selection voltage value, depending on the type of operation (programming, erasing, or reading), while the other word lines are driven to a de-selection voltage value (e.g. the ground voltage).

The column selection is performed by means of the column decoder 140 which receives a column address CADR and provides to each main selector element $135_{<j>}$ a respective main selection signal $Y_{NR<j>}$. In addition, based on their column address CADR, the column decoder 140 generates q local selection signals $Y_{o<m>}$ (m=0, 1, ..., q−1), each of which is supplied to the gate terminal of the m-th local selector $125_{j<m>}$ associated with each local bit line $LBL_{j<m>}$ of each packet $116_j$. The column decoder 140 receives also a pump voltage $V_{CP}$—generally greater than a supply voltage VDD of the memory 100—from a corresponding charge pump (not shown in figure).

Based on the column address CADR, one local selection signal $Y_{o<m>}$ is brought to a high value (e.g. the pump voltage $V_{CP}$), while the other selection signals $Y_{o<m>}$ are brought to a low value (e.g. ground voltage). Furthermore, still according to the column address CADR, for each data block $112_i$ one main selection signal $Y_{NR<j>}$ is brought to a high value ($V_{CP}$), while the remaining is brought to a low value (ground). In this way, the sense amplifier $SA_{<i>}$ appears to be connected to the main bit line $MBL_{i<j>}$ whose main selector $135_{<j>}$ receives a main selection signal $Y_{NR<j>}$ of high value, and—through such main bit line $MBL_{i<j>}$—with the local bit line $LBL_{j<m>}$ of the corresponding packet $116_j$ whose local selector $125_{j<m>}$ receives the local selection signal $Y_{o<m>}$ brought to the high value. The other local bit lines $LBL_{j<m>}$ are instead disconnected from the sense amplifier $SA_{<i>}$. In this way, the datum stored in the memory cell 110 connected to the selected local bit line $LBL_{j<m>}$ is read by the sense amplifier $SA_{<i>}$ by a measure of the current flowing in the same bit line. Consequently, the sense amplifier $SA_{<i>}$ brings an output signal $D_{<i>}$ to an output voltage value corresponding to the data stored in the memory cell 110 (e.g., to a value equal to the supply voltage VDD if in the memory cell 110 it is stored a high value or to a value equal to the ground voltage if in the memory cell 110 it is stored the low value).

To each local bit line $LBL_{j<m>}$ it is associated a parasitic capacitance $C_{LBL<m>}$ of value substantially proportional to the length of the same local bit line $LBL_{j<m>}$. Similarly, to each main bit line $MBL_{i<j>}$ it is associated a parasitic capacitance $C_{MBL<j>}$, which is also of a value proportional to the length of the same main bit line $MBL_{i<j>}$. The parasitic capacitance $C_{MBL<j>}$ is much larger than the parasitic capacitance $C_{LBL<m>}$ due to the greater length of the main bit lines $MBL_{i<j>}$ compared to the local bit lines $LBL_{i<m>}$.

As already mentioned above, in order to prevent the occurrence of errors and/or malfunctions during a reading operation, the electric charges stored in the capacitances $C_{LBL<m>}$ and $C_{MBL<j>}$ of selected local bit lines $LBL_{j<m>}$ and main bit lines $MBL_{i<j>}$ are typically discharged, and then pre-charged to an appropriate pre-charge voltage before the reading activation of the sense amplifiers $SA_{<i>}$. This operation is done by an appropriate internal circuitry of the sense amplifier $SA_{<i>}$ and controlled by a discharge signal DIS and by an equalization signal EQ, as will be described in greater detail later in the present description.

Figure 2:
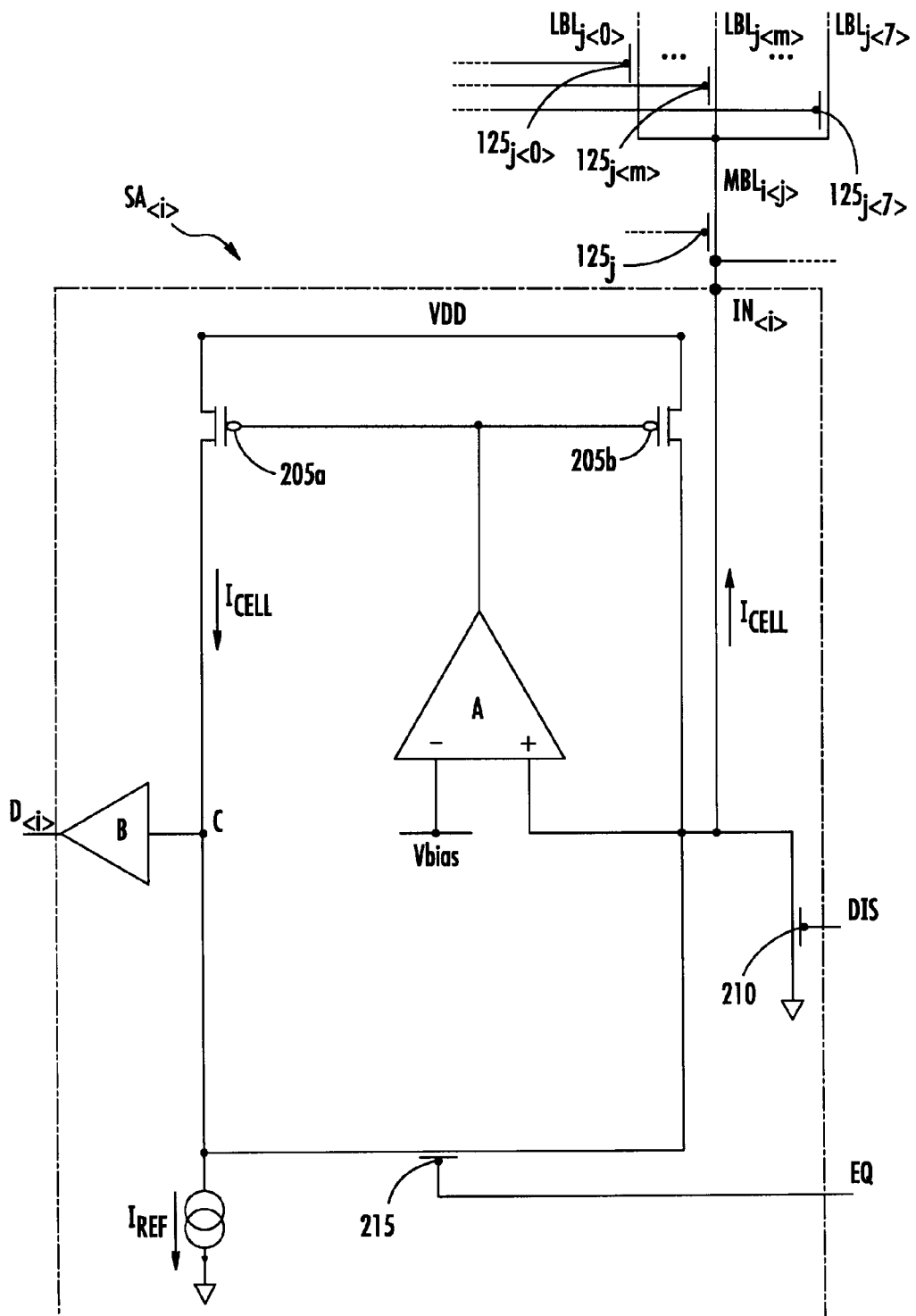
FIG. 2 shows a principle circuit diagram of a sense amplifier included in the circuit of FIG. 1 according to a known in the art implementation.

FIG. 2 shows a principle circuit diagram of the sense amplifier $SA_{<i>}$ according to an implementation known in the art. The sense amplifier $SA_{<i>}$ includes two P-type MOS transistors 205a and 205b both connected via a source terminal to a supply terminal to receive the power supply voltage VDD; the gate terminals of the transistors 205a and 205b are interconnected to each other and to an output terminal of an operational amplifier A. The amplifier A has an inverting terminal (−) connected to a biasing terminal for receiving a pre-charge voltage Vbias (e.g., 0.5-1 V), and a non-inverting terminal (+) connected to an input terminal $IN_{<i>}$ of the sense amplifier $SA_{<i>}$ and to a discharge selector 210 controlled by the discharge signal DIS.

For example, the generic discharge selector 210 is a N-channel MOS-type transistor having a drain terminal connected to the input terminal $In_{<i>}$—and therefore to the main bit line $MBL_{i<j>}$ through the selector $Y_{NR<j>}$—a source terminal connected to a reference terminal that receives the ground voltage and a gate terminal that receives the discharge signal DIS. The input terminal $IN_{<i>}$ is also connected to a drain terminal of the transistor 205b and to an equalizer 215 controlled by the equalization signal EQ. The generic equalizer 215 is, for example, a N-channel MOS-type transistor having a drain terminal connected to the input terminal $IN_{<i>}$ and a source terminal connected to an input terminal (circuit node C) of an output circuit B, and a gate terminal that receives the equalization signal EQ; the node circuit C is also connected to a drain terminal of the transistor 205a and to a first terminal of a current generator REF. The output circuit B is configured to detect the voltage of the node C and generate the output signal $D_{<i>}$ of the sense amplifier $SA_{<i>}$ on the basis of the generated voltage. The generator REF has a second terminal connected to a reference terminal to receive the ground voltage.

With reference to FIGS. 1 and 2 an exemplary reading operation of the flash memory 100, according to a known solution in the state of the art, will now be described. In particular, the reading operation described below is performed on a selected memory cell 110 for each data block $112_i$ in parallel, so as to obtain a reading of a word of n bits (n=128 in the case of the considered example). Each reading operation includes three successive phases, and in particular of a discharge phase, a pre-charge and equalization phase, and a reading phase.

As soon as the selection of the local bit line $LBL_{j<m>}$ and of the main bit line $MBL_{i<j>}$ is brought out by the column decoder 140 based on the address CADR, the sense amplifier $SA_{<i>}$ is turned on and the discharge phase is activated, bringing the discharge signal DIS to a high value (e.g. the supply voltage VDD) to start the discharge phase.

In this way, the selected local bit line $LBL_{j<m>}$ and main bit line $MBL_{i<j>}$ are connected to ground through the discharge selector 210. Therefore, a path to ground through which the charge stored in the parasitic capacitances $C_{LBL<m>}$ and $C_{MBL<j>}$ is discharged is formed. In particular, the discharge selector 210 is configured so as to have a high conductivity in order to quickly discharge the capacitances $C_{MBL<j>}$ and $C_{LBL<m>}$.

After a predetermined interval of time, henceforth referred to as "discharge interval," the discharge signal DIS is brought to the low value to start the pre-charge and equalization phase. In this pre-charge and equalization phase through the negative reaction introduced by the amplifier A, and through a reference current $I_{REF}$ generated by the generator REF and provided to the input terminal of the sense amplifier $SA_{<i>}$ through the transistors 205a and 205b the pre-charge voltage Vbias (e.g., 0.5-1 V) is imposed to the input terminal $IN_{<i>}$ of the sense amplifier $SA_{<i>}$. In this way, the selected local bit line $LBL_{j<m>}$ and main bit line $MBL_{i<j>}$ are biased to the voltage Vbias (more specifically, the parasitic capacitances $C_{LBL<m>}$ and $C_{MBL<j>}$ are charged to the voltage Vbias).

The equalization signal EQ is raised to the high value (the supply voltage VDD) to activate the equalizer 215 so as to connect the input terminal $IN_{<i>}$ to circuit node C. In particular, the equalization signal EQ is maintained to the high value for a time sufficient to bring to the pre-charge voltage Vbias also the circuit node C. The time duration of the pre-charge and equalization phase from now on will be referred to as "pre-charging and equalization interval."

It is stressed that the behaviour in frequency domain of the amplifier A sets a minimum time to complete the pre-charge and equalization phase without generating overshoots that may cause errors during the reading phase.

At the end of the pre-charge and equalization phase, the equalization signal EQ is brought to the low value initiating the reading phase of the memory cell 110 selected through the corresponding word line $WL_{<r>}$. Since the equalization signal EQ is low, the equalizer 215 is opened, disconnecting the node C from the input terminal $IN_{<i>}$ of the sense amplifier $SA_{<i>}$. In this way, the voltage at circuit node C can vary, while the negative feedback maintains the non-inverting terminal of the amplifier A (and therefore the input terminal $IN_{<i>}$) at the pre-charge voltage Vbias.

The local bit line $LBL_{j<m>}$ and main bit line $MBL_{i<j>}$ are crossed by a current $I_{CELL}$ whose value depends on the data stored in the selected memory cell 110. In particular, starting from the power supply terminal of the sense amplifier $SA_{<i>}$, the current $I_{CELL}$ flows through the transistor 205b, the main selector $135_j$, the local selector $125_{j<m>}$ and the selected memory cell 110, in order to reach the ground. The current $I_{CELL}$ is mirrored through transistors 205a and 205b and compared with the current $I_{REF}$ at the node C. In particular, if the current $I_{CELL}$ is higher than the current $I_{REF}$, the voltage at circuit node C increases, exceeding the value assumed in the pre-charge phase (Vbias); else if the current $I_{CELL}$ turns out to be lower than the current $I_{REF}$, then the voltage at circuit node C decreases, assuming a value lower than Vbias.

According to the value assumed by the voltage at node C, the output signal $D_{<i>}$ is brought by the output circuit B to a first voltage value (corresponding to a first logical value) or to a second voltage value (corresponding a second logical value). As a result, the output signal $D_{<i>}$ assumes a value that depends on the data stored in the selected memory cell 110. After the output signal is acquired by a downstream circuitry, the sense amplifier $SA_{<i>}$ is turned off, ending the reading operation.

In the flash memory above described the discharge interval and, in particular, the pre-charge and equalization interval have a non-negligible duration, since the parasitic capacitance associated with the selected main bit line has a large size. Consequently, the total time to complete the reading operation is basically determined by the discharge interval and by the pre-charge and equalization interval.

According to an embodiment of the present invention, the above mentioned issues are addressed by maintaining the main bit line always pre-charged to the pre-charge voltage (thus maintaining always charged the capacity capacitance associated with it) and by discharging/pre-charging the parasitic capacitances of the selected local bit line. In this way it is possible to get discharge and pre-charge and equalization intervals of shorter duration than the prior art, with the advantage of reducing the total time required to complete a reading operation.

In particular, an embodiment of the present invention provides for associating a discharge selector to each local bit line, gathering the local bit lines of each data block in a single packet and associating to a corresponding single main bit line, and maintaining to a constant pre-charge voltage the bit lines during the whole reading operation. During a standby phase the local bit lines are deselected—i.e. they are disconnected from the corresponding main bit line—and biased to a discharge voltage—such as the ground voltage—by the discharge selectors in order to discharge the corresponding parasitic capacitances. During a reading operation directed to the read of the data stored in the addressed memory cells, a corresponding set of local bit lines is selected—i.e. a local bit line in each block is connected to the corresponding main bit line.

Simultaneously with the selection of the local bit lines, the discharge selectors associated with the selected bit lines are disabled. Consequently, each selected local bit line is automatically biased to the pre-charge voltage due to the redistribution of the charge (charge sharing) previously stored in the parasitic capacitance of the main bit line into the parasitic capacitance of the local bit line (initially uncharged). Thereafter, during the reading phase the sense amplifiers are left free to detect the change in the current flowing in the selected bit lines and accordingly generate output voltages dependent on logical values stored in the selected memory cells.

Figure 3:
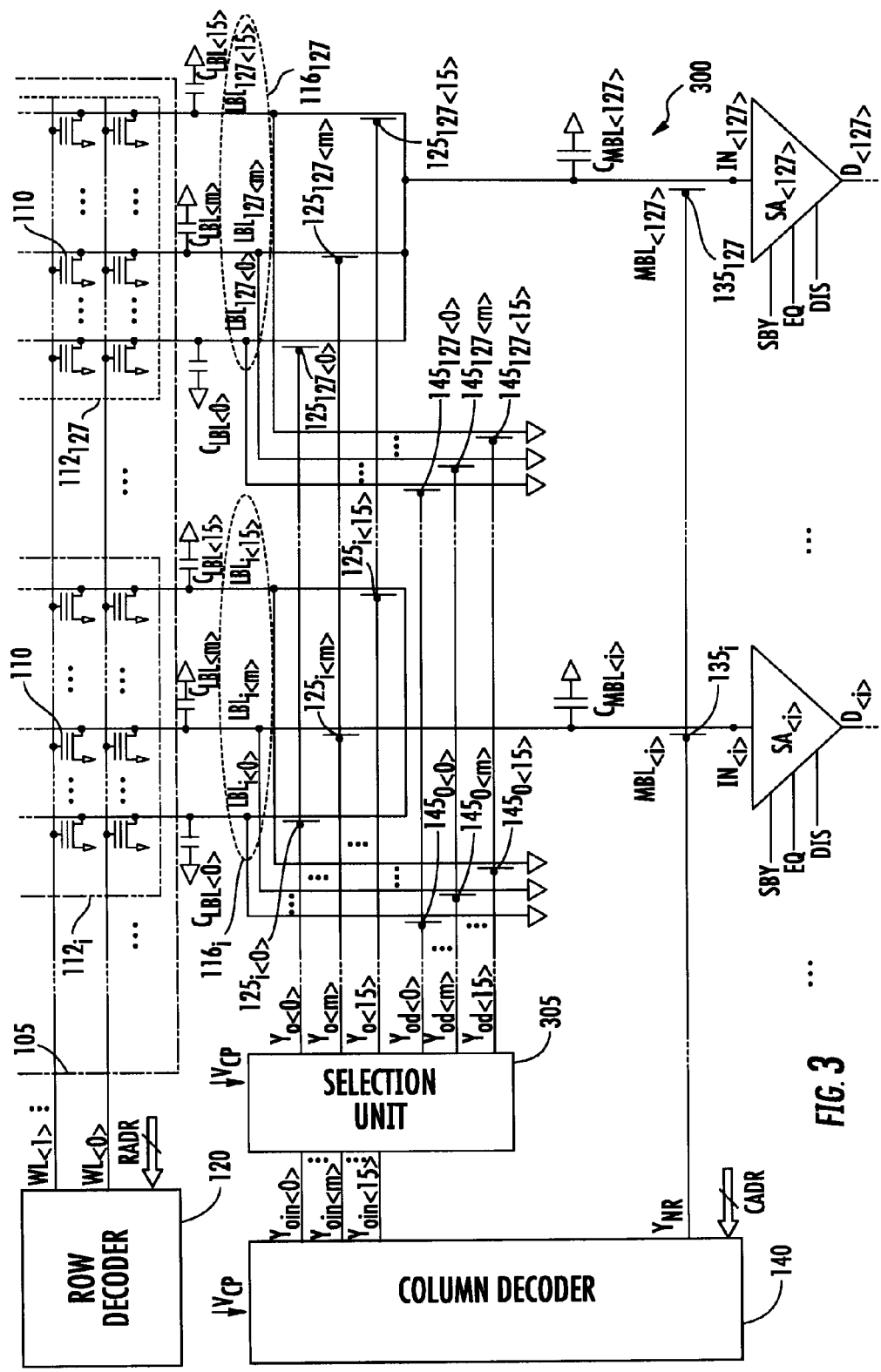
FIG. 3 illustrates a principle block diagram of a portion of a flash memory wherein the solution according to an embodiment of the present invention may be implemented.

According to one embodiment the approach above may be applied by changing the memory described above, as shown in FIG. 3. In particular, in the figure there is shown a flash memory 300 in which each main bit line $MBL_{<i>}$ is connected to a respective sense amplifier $SA_{<i>}$ through the main selector $135_i$ associated therewith. It is to be noted that the main selectors $135_i$ are driven by a same main selection signal $Y_{NR}$, which is maintained to the high value so that each main bit line $MBL_{<i>}$ is connected to the corresponding sense amplifier $SA_{<i>}$ during the operation of the memory 300. In addition the data blocks $112_i$ are no longer divided into separated clusters, but the local bit lines $LBLi_{<m>}$ associated with the columns of each data block $112_i$ are gathered together in one packet $116_i$ and are connected to the corresponding main bit line $MBL_{<i>}$.

Each sense amplifier $SA_{<i>}$ may be of the type described above in relation to FIG. 2, or similar. In addition, each sense amplifier $SA_{<i>}$ is configured for operating in a condition called "standby state", and activated in response to the assertion of a corresponding standby signal SBY. In the standby state, the power consumption of the sense amplifier $SA_{<i>}$ is reduced by lowering the value of the current that supplies the sense amplifier $SA_{<i>}$. The circuit to achieve this condition is known and therefore it will not be described for the sake of brevity.

The memory device 300 includes a number n*p of discharge selectors $145_{i<m>}$ (m=0, 1, . . . , p-1) equal to the number of local bit lines $LBL_{i<m>}$ of the matrix 105, where p is the number of local bit lines $LBL_{i<m>}$ included in the generic packet $116_i$ (in the example shown, p=16). Each discharge selector $145_{i<m>}$ is associated with the m-th local bit line $LBL_{i<m>}$ of the corresponding packet $116_i$. For example, the generic discharge selector $145_{i<m>}$ is a N-channel MOS-type transistor, having a drain terminal connected to the corresponding local bit line $LBL_{i<m>}$, a source terminal connected to a reference terminal which receives the ground voltage, and a gate terminal for receiving a respective discharge signal $Y_{od<m>}$. The local selection signals $Y_{o<m>}$ for the selection of local bit lines $LBL_{i<m>}$ and the discharge signals $Y_{od<m>}$ for the activation of the discharge selectors $145_{i<m>}$ are generated by a special selection unit 305. The selection unit 305 receives the pump voltage $V_{CP}$ from the charge pump (not shown) and is coupled to column decoder 140 to receive p pre-selection signals $Y_{oin<m>}$ generated based on the column address CADR; in particular, each pre-selection signal $Y_{oin<m>}$ corresponds to a respective local bit line $LBL_{i<m>}$ of each packet $116_i$. On the basis of a column address signal CADR only one pre-selection signal $Y_{oin<m>}$ is brought to a low value (e.g. the ground voltage), while other pre-selection signals $Y_{oin<m>}$ are brought to a high value (e.g. the pump voltage $V_{CP}$).

It is important to note that the discharge signal DIS is maintained at low value during the operation of the memory cell 300.

Figure 4:
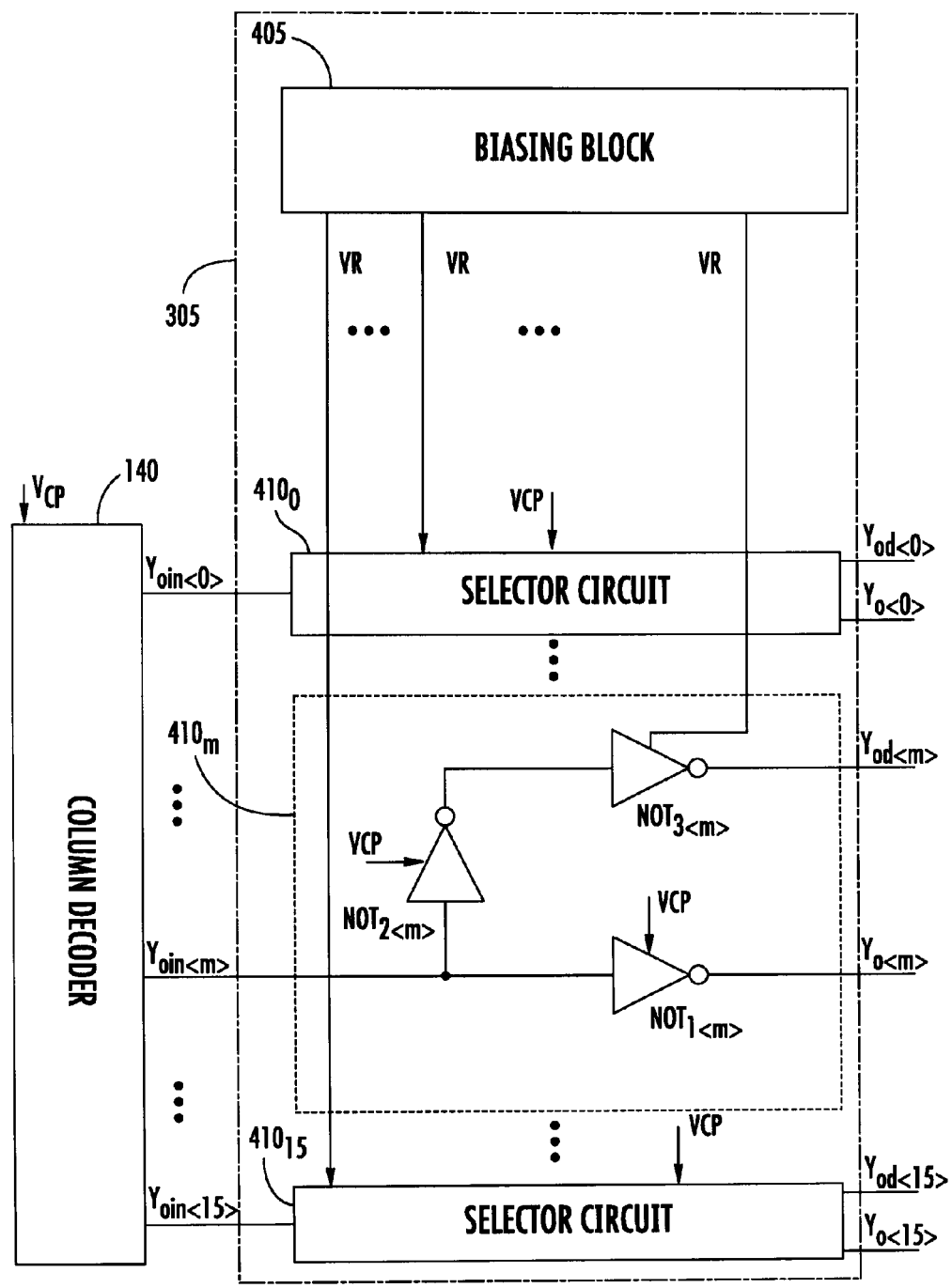
FIG. 4 illustrates a principle block diagram of a selection unit of the memory of FIG. 3 according to an embodiment of the present invention.

In FIG. 4 is shown a principle circuit diagram of the selection unit 305 according to one embodiment of the present invention. The selection unit 305 includes a biasing block 405 and p selector circuit $410_m$, each adapted to receive a signal corresponding to the pre-selection signal $Y_{oin<m>}$.

In more detail, each selector circuit $410_m$ includes a first logic inverter $NOT_{1<m>}$, a second logic inverter $NOT_{2<m>}$ and a third logic inverter $NOT_{3<m>}$. Both logical inverters $NOT_{1<m>}$ and $NOT_{2<m>}$ receive at an input terminal the pre-selection signal $Y_{oin<m>}$, the first logic inverter $NOT_{1<m>}$ generates at an output terminal the local selection signal $Y_{o<m>}$, while an output signal of the second logic inverter $NOT_{2<m>}$ is provided to the input of the third logic inverter NOT$_{3<m>}$. In turn, the third logic inverter NOT$_{3<m>}$ generates at a further output terminal the discharge signal Y$_{od<m>}$. The logical inverters NOT$_{1<m>}$ and NOT$_{2<m>}$ are supplied with the voltage pump V$_{CP}$, while the third logic inverter NOT$_{3<m>}$ is supplied with a biasing voltage V$_R$ generated by the biasing block 405. Therefore, when the pre-selection signal Y$_{oin<m>}$ is at the ground voltage, the selection signal Y$_{o<m>}$ is brought to the pump voltage V$_{CP}$, and the discharge signal Y$_{od<m>}$ is brought to the ground voltage; when instead the pre-selection signal Y$_{oin<m>}$ is at the pump voltage V$_{CP}$, the selection signal Y$_{o<m>}$ is brought to the ground voltage, and the discharge signal Y$_{od<m>}$ is brought to the bias voltage V$_R$.

Figure 5:
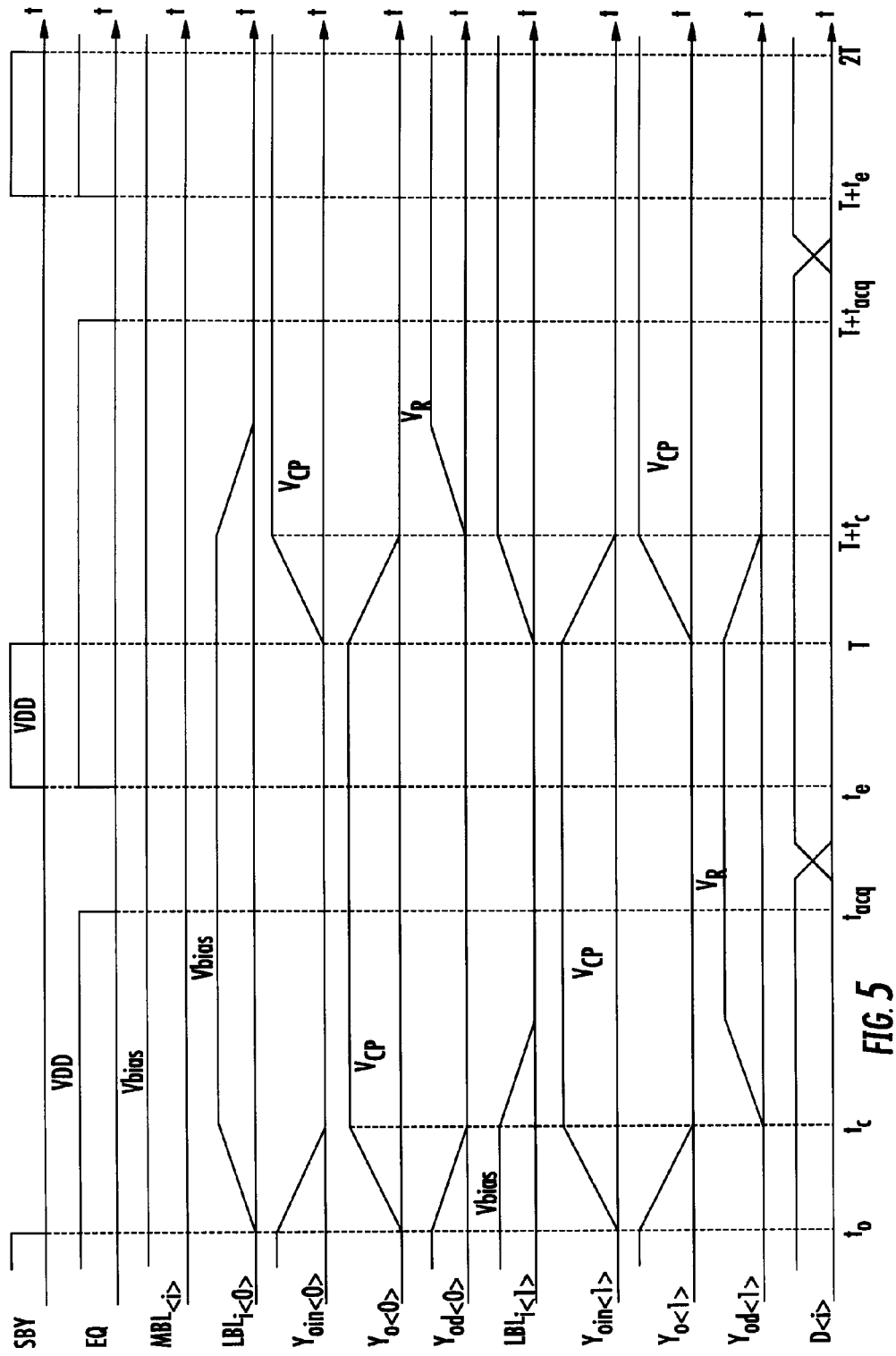
FIG. 5 shows a trend over time of main signals of the flash memory according to an embodiment of the present invention during a reading operation.

Referring jointly to FIGS. 2-5 it will now be shown the operation of the memory 300 during a reading operation according to one embodiment of the present invention. In particular, the FIG. 5 is a plot of the trend over time of some of the signals handled by the flash memory 300 during a reading operation. Also in this case the reading operation is performed in parallel on a memory cell 110 for each data block 112$_i$, obtaining at the end of the reading operation a word of 128 bits in the considered example.

According to one embodiment of the present invention, each reading operation consists essentially of two successive phases, and particularly a selection and pre-charge phase, followed by a reading phase.

During the operation of the memory 300 the main bit lines MBL$_{<i>}$ are always maintained at the pre-charge voltage (Vbias) by the corresponding sense amplifiers SA$_{<i>}$ (always turned on and maintained in a standby state), since their main selectors 135$_i$, are always active. In addition, when the memory 300 is in a standby phase, that is before receiving a reading request of memory cells 110, the local bit line LBL$_{i<m>}$ are deselected (selectors 125$_{i<m>}$ off) and biased to the ground voltage (discharge selectors 145$_{i<m>}$ on).

In the example of FIG. 5, it is shown a sequence of three consecutive reading operations. In particular, finished a first reading operation of n (in the considered example n=128) memory cells 110 (belonging to the matrix 105 of the memory 300) connected to the local bit line LBL$_{i<1>}$, a second reading operation is performed selecting n memory cells 110 connected to the local bit line LBL$_{i<0>}$, and finally a third reading operation is performed by selecting again n memory cells 110 connected to the local bit line LBL$_{i<1>}$.

After the first reading operation (i.e., after the end of the reading phase itself), the pre-selection signal Y$_{oin<1>}$ is at the low value (ground), while other pre-selection signals (including the pre-selection signal Y$_{oin<0>}$) are at the high value (V$_{CP}$). Therefore, the selection signal Y$_{o<1>}$ is at the high value (V$_{CP}$) and the discharge signal Y$_{od<1>}$ is at the low value, and therefore each local bit line LBL$_{i<1>}$ is connected to the corresponding main bit line MBL$_{<i>}$ and then charged to the pre-charge voltage Vbias. In contrast, the remaining selection signals Y$_{o<m>}$, including the selection signal Y$_{o<0>}$, are at the low value, while the discharge signals Y$_{od<m>}$, including the discharge signal Y$_{od<0>}$ are at the high value (V$_R$); as a result, each remaining local bit line LBL$_{i<m>}$, including each local bit line LBL$_{i<0>}$, is disconnected from the respective main bit line MBL$_{<i>}$ and biased to the ground voltage. At the end of the reading operation, each sense amplifier SA$_{<i>}$ is in the standby condition, with the standby signal SBY and the equalization signal EQ at the high value (for example, the supply voltage VDD).

The second reading operation, directed to the memory cells 110 connected to the local bit lines LBL$_{i<0>}$ begins with a selection and pre-charge phase at the instant t$_0$, when the column decoder 140, received a new column address CARR, brings the pre-selection signal Y$_{oin<0>}$ to the low value, while the pre-selection signal Y$_{oin<1>}$, which in the previous reading operation was at the low value, is brought to the high value. At the same instant t$_0$, the standby signal SBY is brought to the low value, to make the sense amplifiers SA$_{<i>}$ exit from the standby condition.

In response to the switching of the pre-selection signals Y$_{oin<0>}$ and Y$_{oin<1>}$, the selection unit 305 causes a switching of the selection signal Y$_{o<0>}$ and Y$_{o<1>}$ and of the discharge signals Y$_{od<0>}$ and Y$_{od<1>}$.

In particular, the selection signal Y$_{o<0>}$ is brought from the low value (ground) to the high value (V$_{CP}$) by the logic inverter NOT$_{1<0>}$, while the selection signal Y$_{o<1>}$ is brought from the high value (V$_{CP}$) to low value (ground) by the logic inverter NOT$_{1<1>}$. The discharge signal Y$_{od<0>}$ is instead brought from the high value (V$_R$) to the low value (ground) by the logic inverter NOT$_{3<0>}$, while the discharge signal Y$_{od<1>}$ is brought from the low value (ground) to the high value (V$_R$) by the logic inverter NOT$_{3<1>}$. In this situation, the selectors 125$_{i<0>}$ are active, whereas the corresponding discharge selectors 145$_{i<0>}$ are off. Consequently, each local bit line LBL$_{i<0>}$ is connected to the corresponding main bit line MBL$_{<i>}$, and automatically pre-charged to the pre-charge voltage Vbias through a redistribution of the charge present in the parasitic capacitance C$_{MBL<i>}$ of the main bit line MBL$_{<i>}$, which is always maintained at the pre-charge voltage Vbias.

Moreover, since the other selectors 125$_{1<m>}$ (including the selectors 125$_{i<1>}$) are off and the other discharge selectors 145$_{i<1>}$ (including the discharge selectors 145$_{i<1>}$) are active, the other local bit lines LBL$_{i<m>}$ (including the local bit lines LBL$_{i<1>}$) are biased to the ground voltage.

By setting the biasing voltage V$_R$ generated by the biasing block 405—and provided as power supply to each logical inverter NOT$_{3<m>}$, in particular to the logic inverter NOT$_{3<1>}$—to a value lower than the pump voltage V$_{CP}$ is possible to delay the switching of the discharge signal Y$_{od<1>}$ from the low value (ground) to the high value (V$_R$). In particular, the biasing voltage V$_R$ is set as that the discharge signal Y$_{od<1>}$ is maintained to the low value (ground) during the entire switching interval of the selection signal Y$_{o<1>}$ from the high value (at time t$_0$) until the reaching of the low value (instant t$_c$). In facts, during such switching interval, the selectors 125$_{i<1>}$, are, at least partially, active, maintaining connected the corresponding main bit lines MBL$_{<i>}$. Without introducing the switching delay of the discharge signal Y$_{od<1>}$, the discharge selectors 145$_{i<1>}$ would be turned on when the local bit line LBL$_{i<1>}$ are still connected to their main bit lines MBL$_{<i>}$, discharging the latter through the conductive path to ground formed by the selectors 125$_{i<1>}$, local bit lines LBL$_{i<1>}$ and discharge selectors 145$_{i<1>}$; this condition is disadvantageous, since would cause the discharge of the main bit line MBL$_{<i>}$, the increase in the electric power consumption of the sense amplifier SA$_{<i>}$, and would lead to an increase in the total duration of the reading operation. Moreover, such condition would lead to the occurrence of relatively high current pulses, such as to further increase the electrical power consumption and the temperature of the memory 300, and at the same time would cause electromagnetic compatibility issues.

At a successive acquisition instant t$_{acq}$ the reading phase starts, which is provided for carrying the equalization signal EQ to the low value, to allow the circuit node C of each sense amplifier SA$_{<i>}$ to vary its voltage in order to detect presence or absence of current flowing through the selected memory cells 110 and to determine the data stored therein. According to the detected currents, each sense amplifier $SA_{<i>}$ provides the corresponding output signal $D_{<i>}$.

The reading phase ends at a reading end instant $t_e$, in which each output signal $D_{<i>}$ is acquired by a processing circuitry (not shown) of the memory 300, while the standby signal SBY and the equalization signal EQ are brought to the high value so as the sense amplifiers $SA_{<i>}$ enter their standby condition maintaining, however, the corresponding main bit lines $MBL_{<i>}$ to the pre-charge voltage Vbias.

The third reading operation starts at a successive instant T, in which the column decoder 140, received again the column address CADR, brings the pre-selection signal $Y_{oin<1>}$ to the low value, while the pre-selection signal $Y_{oin<0>}$ is brought to the high value. At the same instant T, the standby signal SBY is brought to the low value, in order to make the sense amplifiers $SA_{<i>}$ exit the standby condition, and then start a new selection and pre-charge phase.

In response to the switching of the pre-charge signals $Y_{oin<0>}$ and $Y_{oin<1>}$, the selection unit 305 causes a switching of the selection signals $Y_{o<0>}$ and $Y_{o<1>}$ and of the discharge signals $Y_{od<0>}$ and $Y_{od<1>}$.

In particular, the selection signal $Y_{o<0>}$ is brought from the high value ($V_{CP}$) to the low value (ground) by logic inverter $NOT_{1<0>}$, while the selection signal $Y_{o<1>}$ is brought from the low value (ground) to the high value ($V_{CP}$) by the logic inverter $NOT_{1<1>}$. The discharge signal $Y_{od<0>}$ is instead brought from the low value (ground) to the high value ($V_R$) by the logic inverter $NOT_{3<0>}$, while the discharge signal $Y_{od<1>}$ is brought from the high value ($V_R$) to the low value (ground) by the logic inverter $NOT_{3<1>}$. In this situation, the selectors $125_{i<1>}$ are active, while the discharge selectors $145_{i<1>}$ are off. Consequently, each local bit line $LBL_{i<1>}$ is connected to the corresponding main bit line $MBL_{<i>}$, and automatically pre-charged to the pre-charge voltage Vbias through a redistribution of the charge present in the corresponding parasitic capacitance $C_{MBL<i>}$.

Moreover, since the other selectors $125_{i<m>}$ (including the selectors $125_{i<0>}$) are off and the other discharge selectors $145_{<m>}$ (including the discharge selectors $145_{<0>}$) are active, the other local bit lines $LBL_{i<m>}$ (including the local bit lines $LBL_{i<1>}$) are biased to the ground voltage.

In a similar way as above-described, setting the bias voltage $V_R$ generated by the biasing block 305—and provided as a power supply to the logic inverter $NOT_{3<<0>}$—to a value lower than the pump voltage $V_{CP}$ it is possible to delay the switching of the discharge signal $Y_{od<0>}$ from the low value (ground) to the high value ($V_R$). In particular, the biasing voltage $V_R$ is set so as to cause the discharge signal $Y_{od<0>}$ to be maintained to the low value (ground) during the entire switching interval of the selection signal $Y_{o<0>}$ from the high value (at instant T) until reaching of the low value (instant T+tc), thus avoiding the same disadvantages described above.

The operations then continue in the same manner as described above.

In a solution according to one embodiment of the present invention, with each new power on, the memory 300 performs a corresponding boot cycle. In more detail, at the power on of the memory 300 the main bit lines $MBL_{<i>}$ are discharged by the corresponding sense amplifier $SA_{<i>}$, bringing the discharge signal DIS to the logical high value. The column decoder 140 then brings to the high level the pre-selection signals $Y_{oin<m>}$; therefore the selection unit 305 brings to the low value the selection signals $Y_{o<m>}$ and to the high value ($V_R$) the discharge signals $Y_{od<m>}$. In this way, the selectors $125_{i<m>}$ are off, and the discharge selectors $145_{i<m>}$ are active. Therefore, during the boot cycle the local bit lines $LBL_{i<m>}$ are deselected and connected to the reference terminal in order to completely discharge the capacitance $C_{LBL<m>}$ associated therewith. Then, each sense amplifier $SA_{<i>}$ brings the corresponding main bit line $MBL_{<i>}$ to the pre-charge voltage Vbias; once reached this pre-charge voltage VBIAS the standby signal SBY is brought to the high level to reduce the power consumption of the memory 300.

At this point the memory 300 enters the standby phase, in which each main bit line $MBL_{<i>}$ is biased to the pre-charge voltage, each local bit line $LBL_{i<m>}$ is biased to the ground voltage and each sense amplifier $SA_{<i>}$ is ready to detect changes in current flow through the memory cell 110 as the signals SBY and EQ are brought to the low value.

It should be noted that memory 300 can also be controlled so as to operate in the above-described manner known in the art, that is by discharging each selected main bit line $MBL_{<i>}$ prior to each reading operation. It is possible to discharge the main bit line $MBL_{<i>}$ of each data block $112_i$, through the corresponding sense amplifier $SA_{<i>}$, bringing to the logical high value the discharge signal DIS before the selectors $125_{i<m>}$ connect the selected bit lines LBL to the main bit line $MBL_{<i>}$.

The memory 300 according to one embodiment of the present invention grants the possibility of a reading operation of n memory cells 110 in parallel, in an extremely short time, e.g. in a time lower than 30 ns. In addition, during the reading operation the intensity of the spurious currents is substantially reduced, thereby reducing the consumption of electric power, the temperatures increasing and, in particular, the electromagnetic compatibility issues of the memory 300 associated therewith.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

It should be readily apparent that the proposed structure might be part of the design of an integrated device. The design may also be created in a programming language; in addition, if the designer does not manufacture the integrated device or its masks, the design may be transmitted through physical means to others. Anyway, the resulting integrated device may be distributed by its manufacturer in the form of a raw wafer, as a naked chip, or in packages. Moreover, the proposed structure may be integrated with other circuits in the same chip, or it may be mounted in intermediate products (such as motherboards) and coupled with one or more other chips (such as a processor). In any case, the memory device is adapted to be used in complex systems (such as automotive applications or microcontrollers).

That which is claimed is:

1. An electrically erasable and programmable non-volatile memory device comprising:
a plurality of memory cells arranged in rows and columns;
a plurality of main bit lines;
a plurality of reference terminals;
a plurality of local bit lines, wherein each column of the memory cells is associated with a respective local bit line and said plurality of local bit lines is divided into packets of local bit lines, each packet of local bit lines is associated with a respective one of said plurality of main bit lines, each of said plurality of local bit lines of each packet is selectively coupleable to its associated respective one of said plurality of main bit lines, and each local bit line is selectively coupleable to a respective one of said plurality of reference terminals for receiving a reference voltage via a corresponding discharge selector, wherein each discharge selector is active when the electrically erasable and programmable non-volatile memory device is in a standby state;
biasing circuitry configured to bias each main bit line to a pre-charge voltage during operation of the electrically erasable and programmable non-volatile memory device; and
reading circuitry configured to select and access a group of memory cells during a reading operation, said reading circuitry including
selection circuitry configured to select each local bit line associated with each memory cell of the group by activating a corresponding selector and disabling a corresponding discharge selector, and
measuring circuitry configured to measure currents flowing in the selected local bit lines for reading data stored in the memory cells of the group.

2. The electrically erasable and programmable non-volatile memory device according to claim 1, wherein each memory cell of the selected group is associated with a local bit line of a different packet of local bit lines.

3. The electrically erasable and programmable non-volatile memory device according to claim 1, wherein the selection circuitry is configured to maintain the discharge selectors of each unselected local bit line.

4. The electrically erasable and programmable non-volatile memory device according to claim 1, wherein each main bit line is associated with a corresponding sense amplifier, said measuring circuitry and said biasing circuitry being included in said sense amplifiers.

5. The electrically erasable and programmable non-volatile memory device according to claim 4, wherein said sense amplifiers are configured to operate in a power-saving condition between two successive reading operations.

6. The electrically erasable and programmable non-volatile memory device according to claim 1, wherein said selection circuitry is configured to, at the end of a reading operation, deactivate the selectors of the local bit lines associated with memory cells of the selected group, and activate the discharge selectors of the local bit lines associated with the memory cells of the selected group.

7. The electrically erasable and programmable non-volatile memory device according to claim 6, wherein the selecting circuitry further includes delay circuitry for delaying activation of the discharge selectors, at the end of the reading operation.

8. The electrically erasable and programmable non-volatile memory device according to claim 1, wherein, during a power up phase of the electrically erasable and programmable non-volatile memory device, said biasing circuitry is configured to bias at the reference voltage each main bit line, and said selection circuitry is configured activate each discharge selector.

9. An electrically erasable and programmable non-volatile memory device comprising:
a plurality of memory cells arranged in rows and columns;
a plurality of main bit lines;
a plurality of reference terminals;
a plurality of local bit lines, wherein each column of the memory cells is associated with a respective local bit line and said plurality of local bit lines is divided into packets of local bit lines, each packet of local bit lines is associated with a respective one of said plurality of main bit lines, each of said plurality of local bit lines of each packet is selectively coupleable to its associated respective one of said plurality of main bit lines via a corresponding selector, and each local bit line is selectively coupleable to a respective one of said plurality of reference terminals for receiving a reference voltage via a corresponding discharge selector, wherein each discharge selector is active when the electrically erasable and programmable non-volatile memory device is in a standby state; and
biasing circuitry configured to bias each main bit line to a pre-charge voltage during operation of the electrically erasable and programmable non-volatile memory device.

10. The electrically erasable and programmable non-volatile memory device according to claim 9, wherein each memory cell of the selected group is associated with a local bit line of a different packet of local bit lines.

11. A method for operating an electrically erasable and programmable non-volatile memory device comprising a plurality of memory cells arranged in rows and columns, each column of memory cells being associated with a respective one of a plurality of local bit lines, the plurality of local bit lines being divided into packets of local bit lines, each packet of local bit line being associated with a respective main bit line, each local bit line being selectively coupleable to a respective main bit line by a corresponding selector, each local bit line being selectively coupleable to a reference terminal for receiving a reference voltage by a corresponding discharge selector, each discharge selector being active when the electrically erasable and programmable non-volatile memory device is in a standby state, the method comprising:
biasing the main bit lines to a pre-charge voltage during operation of the electrically erasable and programmable non-volatile memory device;
selecting and accessing a group of memory cells during a reading operation, the selecting and accessing including
selecting each local bit line associated with each memory cell of the group by activating the corresponding selector and disabling the corresponding discharge selector, using selection circuitry, and
measuring currents flowing in the selected local bit lines for reading data stored in the memory cells of the group, using measurement circuitry.

12. The method according to claim 11, wherein the selection circuitry is configured to maintain the discharge selectors of each unselected local bit line.

13. The method according to claim 1, wherein the selection circuitry is configured to, at the end of a reading operation, deactivate the selectors of the local bit lines associated with memory cells of the selected group, and activate the discharge selectors of the local bit lines associated with the memory cells of the selected group.

14. The method according to claim 13, wherein the selection circuitry further includes delay circuitry for delaying activation of the discharge selectors, at the end of the reading operation.

* * * * *